US006901993B2

(12) United States Patent
Lee et al.

(10) Patent No.: US 6,901,993 B2
(45) Date of Patent: Jun. 7, 2005

(54) HEAT SINK ASSEMBLY HAVING COMBINED FINS

(75) Inventors: Hsieh Kun Lee, Tu-Chen (TW); WanLin Xia, Shenzhen (CN); HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/795,061

(22) Filed: Mar. 5, 2004

(65) Prior Publication Data

US 2004/0206475 A1 Oct. 21, 2004

(30) Foreign Application Priority Data

Mar. 5, 2003 (TW) ........................................ 92203296 U

(51) Int. Cl.⁷ .................................................. F28F 7/00
(52) U.S. Cl. ...................... 165/80.3; 165/185; 361/697; 361/703; 257/706; 174/16.3
(58) Field of Search .............................. 165/80.3, 185; 361/695, 697, 703–710; 257/706, 722

(56) References Cited

U.S. PATENT DOCUMENTS

| | | | | | |
|---|---|---|---|---|---|
| 2,434,676 A | * | 1/1948 | Spender | ...................... | 165/182 |
| 5,558,155 A | * | 9/1996 | Ito | .............................. | 165/80.3 |
| 6,279,648 B1 | * | 8/2001 | Diels et al. | ................. | 165/80.3 |
| 6,321,451 B1 | * | 11/2001 | Lee et al. | ................. | 29/890.03 |
| 6,336,498 B1 | * | 1/2002 | Wei | ............................. | 165/185 |
| 6,340,056 B1 | * | 1/2002 | Huang | ........................ | 165/185 |
| 6,382,307 B1 | * | 5/2002 | Wang et al. | ........... | 165/104.33 |
| 6,401,810 B1 | * | 6/2002 | Kuo | ........................... | 165/185 |
| 6,446,709 B1 | * | 9/2002 | Huang | ........................ | 165/80.3 |
| 6,449,160 B1 | * | 9/2002 | Tsai | ........................... | 361/709 |
| 6,607,023 B2 | * | 8/2003 | Ho et al. | ........................ | 165/78 |
| 6,607,028 B1 | * | 8/2003 | Wang et al. | ................. | 165/185 |
| 6,619,381 B1 | * | 9/2003 | Lee | ............................. | 165/78 |
| 6,644,386 B1 | * | 11/2003 | Hsu | ........................... | 165/80.3 |
| 6,651,733 B1 | * | 11/2003 | Horng et al. | .............. | 165/80.3 |
| 6,657,865 B1 | * | 12/2003 | Tseng | ........................ | 361/709 |
| 6,672,379 B1 | * | 1/2004 | Wang | ........................ | 165/185 |
| 6,729,385 B1 | * | 5/2004 | Huang et al. | .............. | 165/80.3 |
| 2004/0159421 A1 | * | 8/2004 | Wang | | |

* cited by examiner

Primary Examiner—Terrell McKinnon
(74) Attorney, Agent, or Firm—Wei Te Chung

(57) ABSTRACT

A heat sink assembly (20) includes a number of parallel first fins (40) and a number of parallel second fins (60) each having a main body (44, 64). A number of latch slots (46) is defined in the main body of each first fin. A number of latches (66) extends from the main body of each second fin in opposite directions. The first fins and the second fins are assembled together in interleaved fashion, so that the latches of each second fin engage in the latch slots of two adjacent first fins respectively.

18 Claims, 5 Drawing Sheets

HEAT SINK ASSEMBLY HAVING COMBINED FINS

BACKGROUND OF THE INVENTION

1. Field of the Invention

The present invention relates to cooling apparatuses for controlling temperature rises in heat generating parts in electrical equipment, and more particularly to a heat sink assembly having combined fins for dissipating heat generated by an electrical package such as a Central Processing Unit (CPU).

2. Prior Art

During operation of a computer, heat is generated by the electrical components thereof, and especially by electronic packages such as central processing units (CPUs). High-speed processing of signals by a CPU results in a correspondingly high amount of heat being generated. Thus, cooling of CPUs is an important consideration in designing computers.

Referring to FIG. 4, U.S. Pat. No. 4,884,331 discloses an aluminum-extruded heat sink 10 having a comb-shaped cross section. The heat sink 10 comprises a base, and a plurality of cooling pins extending from the base. Heat is first conducted to the base and then to the cooling pins, whereupon the heat is radiated to ambient air. Because heat radiation mainly occurs at the surfaces of the cooling pins, a large total surface area of the cooling pins is required when configuring the heat sink. This can be obtained by configuring more cooling pins on the base, or by providing elongated cooling pins. However, a thickness and a height of the cooling pins are limited due to inherent restrictions in the relevant fabrication processes. In the case of fabrication by extrusion, the maximum attainable ratio of the height h of each pin and the distance d between two adjacent pins is approximately 13 to 1. This limits the total surface area of the cooling pins per unit area of the base of the heat sink 10.

In order to obtain a larger heat-radiating surface area, heat sinks having a plurality of jointed plates or fins have been developed. Referring to FIG. 5, one such heat sink 30 comprises a plurality of plates 32 having top and bottom flanges 34. Each top and bottom flange 34 defines a pair of locking slots 36 near opposite ends thereof, and comprises a pair of insertion tabs 38 extending from adjacent the locking slots 36. Each insertion tab 38 forms a bulge 39 on a top side thereof, and defines a recess in an underside thereof. In assembly, the insertion tabs 38 of a rear one of the plates 32 are inserted into the locking slots 36 of an adjacent front one of the plates 32. The bulges 39 of the insertion tabs 38 of the rear plate 32 are engaged in the recesses of the insertion tabs 38 of the front plate 32, so that the rear plate 32 is connected to the front plate 32. Other plates 32 are attached to the combined rear and front plates 32 in the same way.

However, the locking slots 36 and the insertion tabs 38 are formed on a periphery of a main body of each plate 32. When the plates 32 are made very large in order to provide large heat radiating surfaces, the center portions of the main bodies of the plates 32 are liable to easily deform. When this happens, the passage for air flow between adjacent plates 32 is narrowed, or may even be blocked altogether. In addition, the engagement between the bulges 39 and the recesses is unstable. The heat sink assembly 30 is prone to be split apart when subjected to shock or vibration during transportation or use.

SUMMARY OF THE INVENTION

Accordingly, an object of the present invention is to provide a heat sink assembly having a plurality of fins ensuring free air flow through passages between adjacent fins.

Another object of the present invention is to provide with a heat sink assembly having a plurality of fins securely interconnected with each other.

To achieve the above-mentioned objects, a heat sink assembly in accordance with a preferred embodiment of the present invention comprises a plurality of parallel first fins and a plurality of parallel second fins each having a main body. A plurality of latch slots is defined in the main body of each first fin. A plurality of latches extends from the main body of each second fin in opposite directions. The first fins and the second fins are assembled together in interleaved fashion, so that the latches of each second fin engage in the latch slots of two adjacent first fins respectively.

Other objects, advantages and novel features of the present invention will be drawn from the following detailed description of the preferred embodiment of the present invention with attached drawings, in which:

DESCRIPTION OF THE PREFERRED EMBODIMENTS

Figure 1:
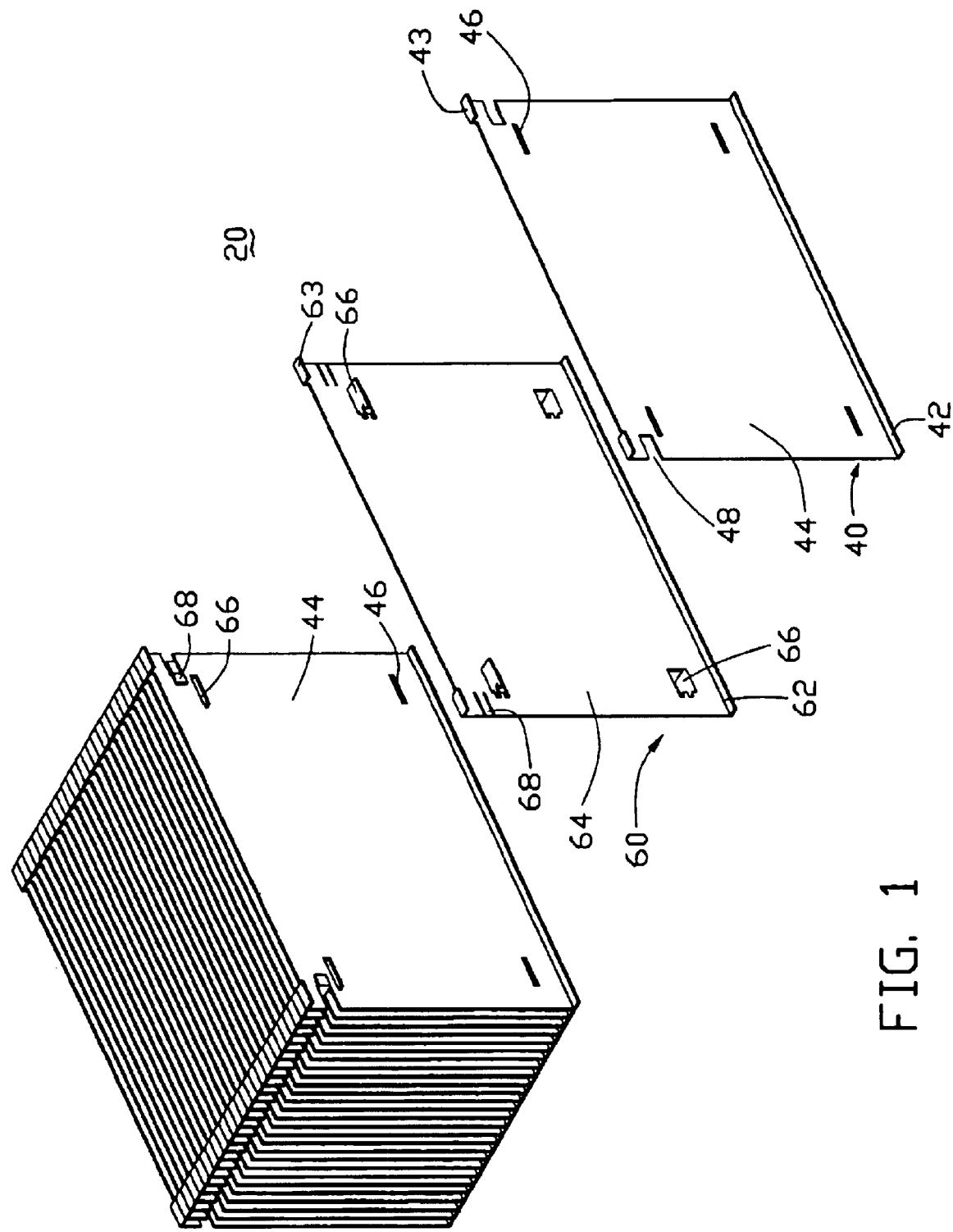
FIG. 1 is a partially exploded, isometric view of a heat sink assembly in accordance with the preferred embodiment of the present invention, the heat sink assembly comprising a plurality of first fins, and a plurality of second fins interleaved with the first fins.

Referring to FIG. 1, a heat sink assembly 20 in accordance with the preferred embodiment of the present invention comprises a plurality of first fins 40, and a plurality of second fins 60 interleaved and interlocking with the first fins 40.

Each first fin 40 comprises a flat main body 44 having a perpendicular bottom flange 42. A pair of bent tabs 43 extends perpendicularly forwardly from opposite ends of a top edge of the main body 44 of the first fin 40. Four latch slots 46 are defined in the main body 44, generally in two upper corner sections and two lower corner sections of the main body 44 respectively. Preferably, the latch slots 46 are located around a center portion of the main body 44. The four latch slots 46 are designated hereinafter as upper slots 46 and lower slots 46 according to their respective locations. A pair of cutouts 48 is defined in opposite sides of the main body 44, below the bent tabs 43 respectively.

Figure 2:
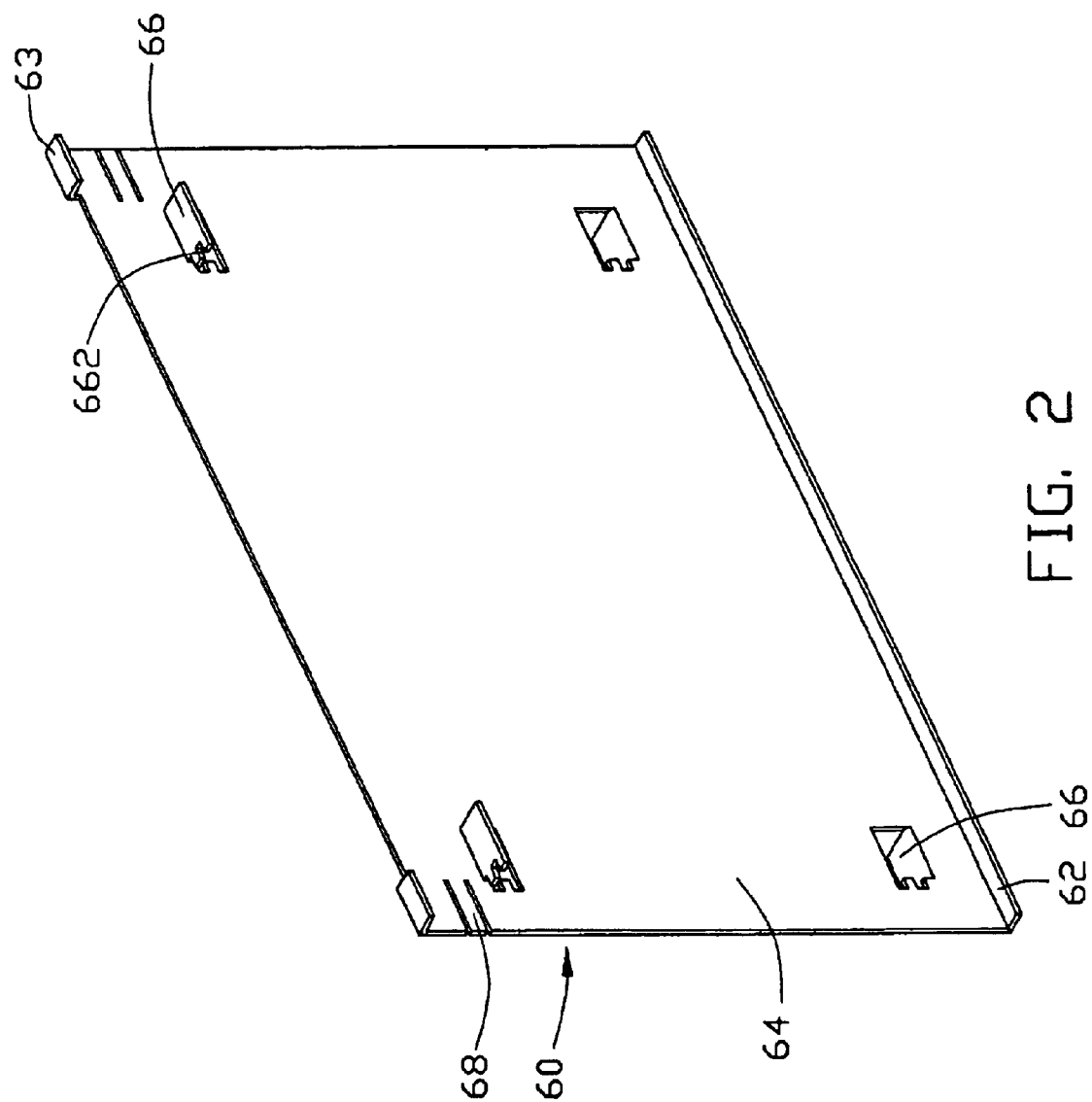
FIG. 2 is an enlarged, isometric view of one of the second fins of the heat sink assembly of FIG. 1.

Referring also to FIG. 2, each second fin 60 comprises a main body 64 having a perpendicular bottom flange 62. The main body 64 of the second fin 60 has a same height as the main body 44 of each first fin 40. A pair of bent tabs 63 extends perpendicularly forwardly from opposite ends of a top edge of the main body 64 of the second fin 60. Four latches 66 extend perpendicularly from two upper corner sections and two lower corner sections of the main body 64 respectively, corresponding to the latch slots 46 of two adjacent first fins 40 that are disposed in front of and behind the second fin 60 respectively. The four latches 66 are designated hereinafter as upper latches 66 and lower latches 66 according to their respective locations. The upper latches 66 extend forwardly, and correspond to the upper latch slots 46 of the first fin 40 in front of the second fin 60. The lower latches 66 extend rearward, and correspond to the lower latch slots 46 of the first fin 40 behind the second fin 60. Each latch 66 defines a notch 662 in a short edge thereof that is perpendicular to the main body 64. A width of the notch 662 is substantially equal to a thickness of each first fin 40. The notches 662 are defined in corresponding same short edges of the latches 66. Preferably, the latches 66 are formed by stamping the main body 64 of the second fin 60. A pair of tongues 68 is formed at opposite sides of the main body 64 above the upper latches 66 respectively, corresponding to the cutouts 48 of the first fin 40 that is in front of the second fin 60.

Figure 3:
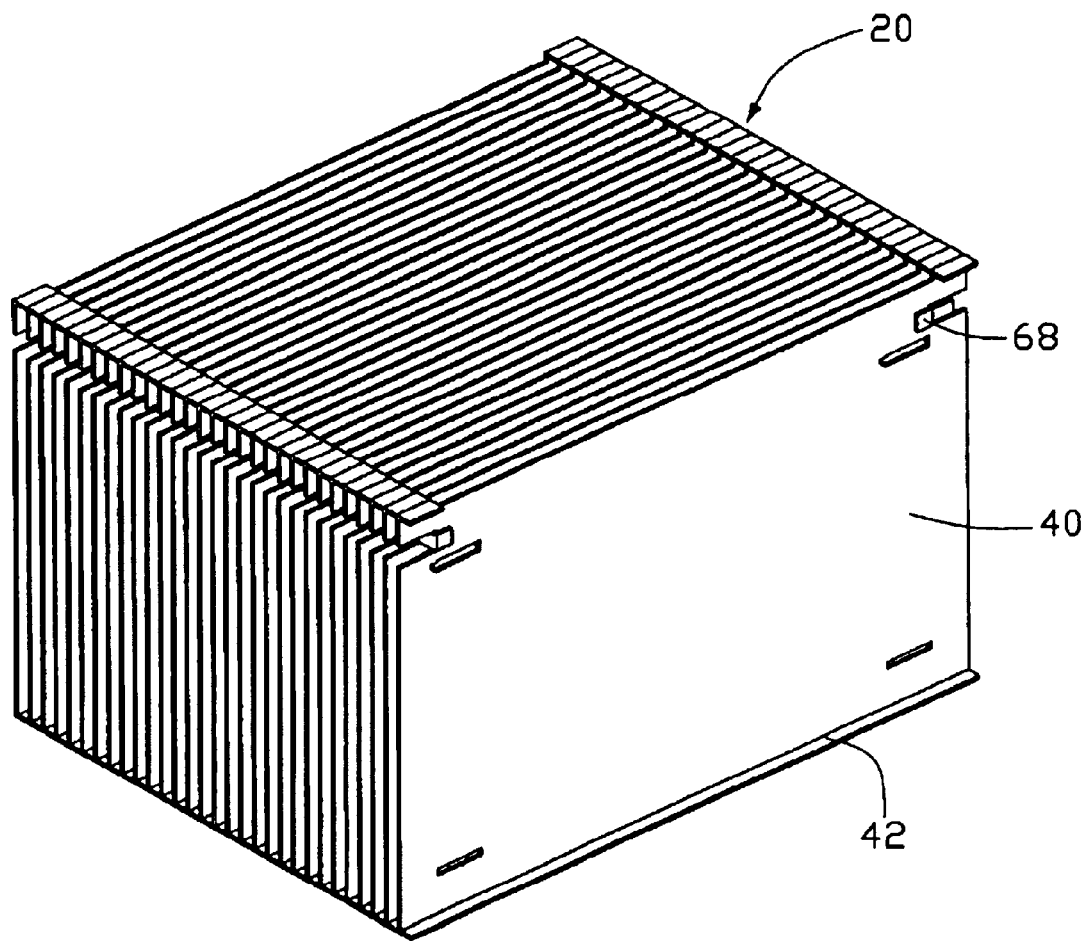
FIG. 3 is a fully assembled view of the heat sink assembly of FIG. 1.
Figure 4:
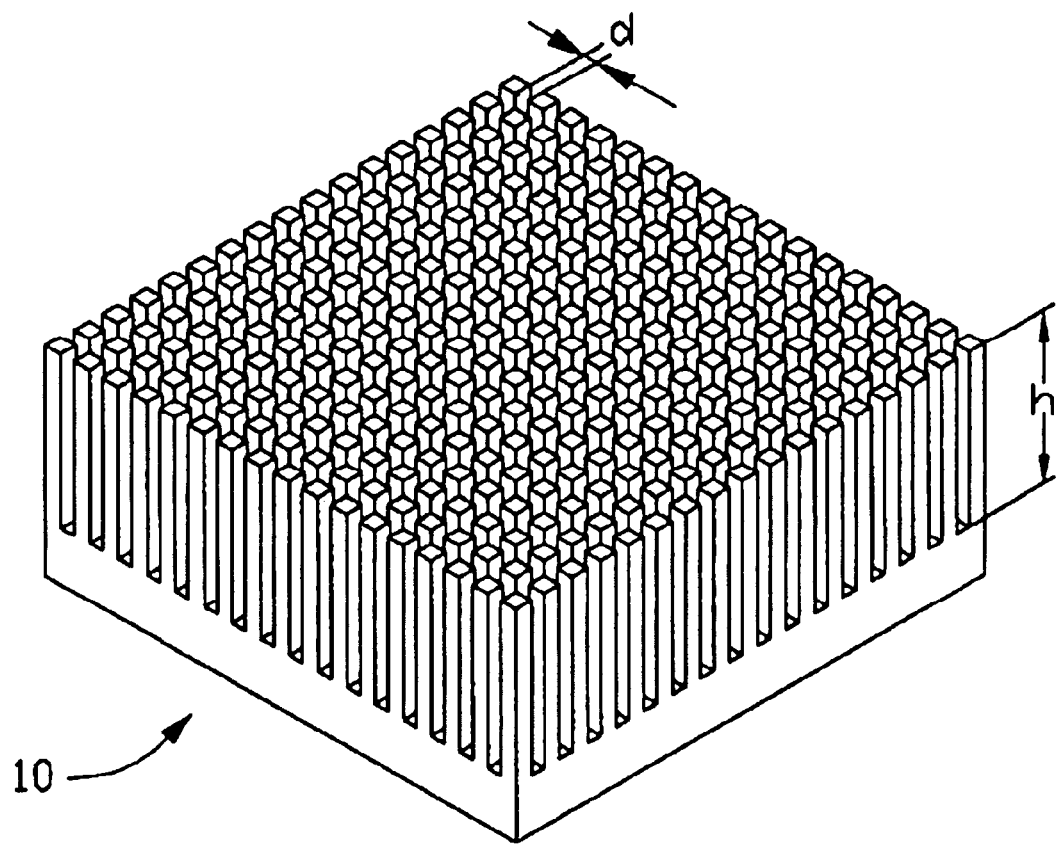
FIG. 4 is an isometric view of a conventional aluminum-extruded heat sink.
Figure 5:
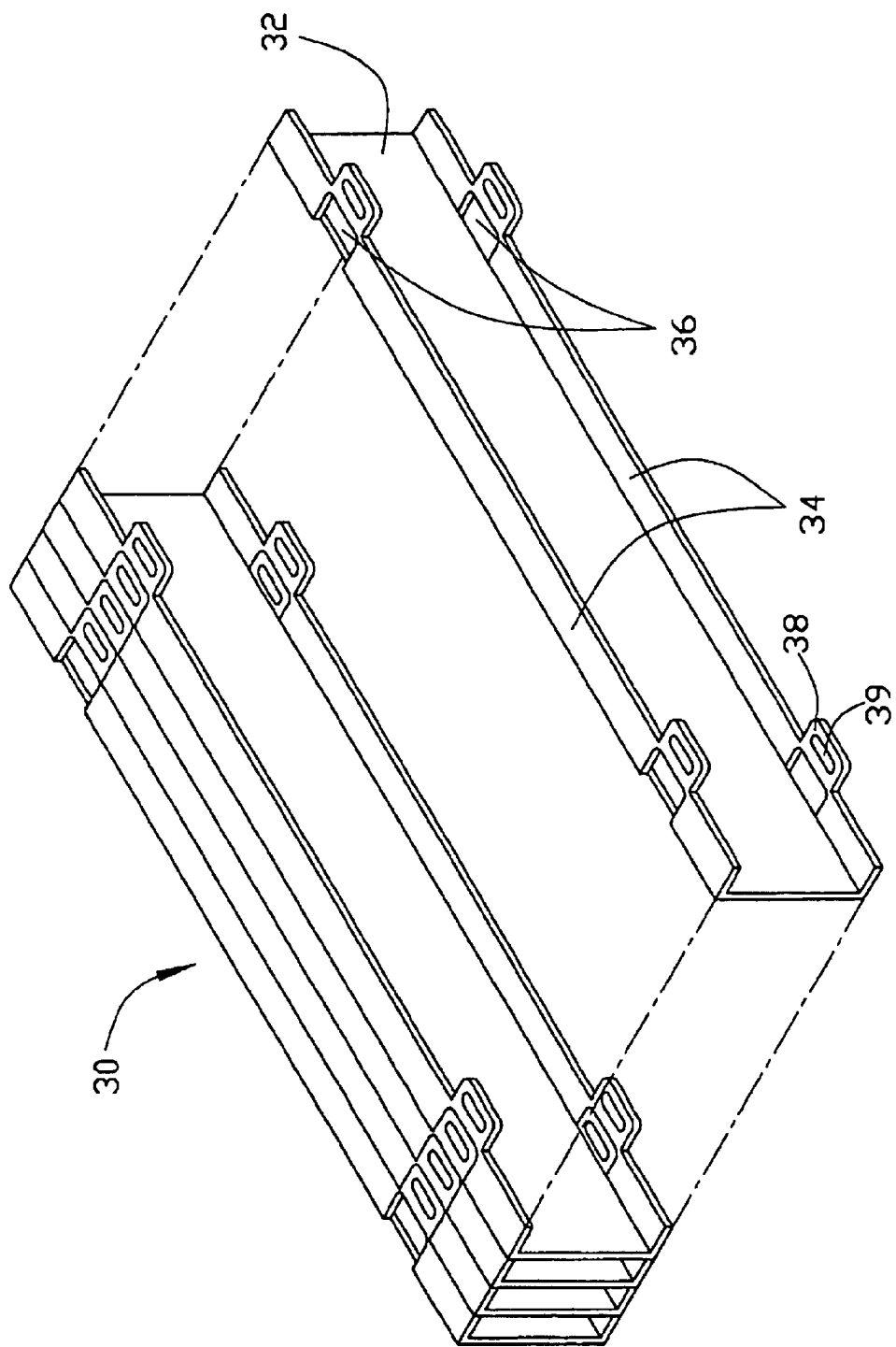
FIG. 5 is a simplified, isometric view of a conventional heat sink assembly comprising a plurality of interlocking plates.

Referring also to FIG. 3, in assembly, one of the second fins 60 is placed in front of and parallel to one of the first fins 40. The lower latches 66 of the second fin 60 are aligned with the lower latch slots 46 of the first fin 40. The second fin 60 is moved rearward in a first direction toward the first fin 40 so that the lower latches 66 are received through the lower latch slots 46. The second fin 60 is then moved in a second direction that is perpendicular to the first direction, so that the notches 662 of the lower latches 66 engagingly receive the first fin 40 at corresponding ends of the lower latch slots 46. The second fin 60 is thus connected to the first fin 40, with a uniform space separating the first and second fins 40, 60. The bent tabs 43 of the first fin 40 abut against the bent tabs 63 of the second fin 40. The bottom flange 42 of the first fin 40 abuts against a bottom edge of the second fin 60, and is coplanar with the bottom flange 62 of the second fin 60.

A next first fin 40 is placed in front of and parallel to the second fin 60, with the upper latch slots 46 of said next first fin 40 being aligned with the upper latches 66 of the second fin 60, and the cutouts 48 of said next first fin 40 being disposed a short distance from corresponding tongues 68 of the second fin 60. Said next first fin 40 is moved in the first direction toward the second fin 60. The upper latches 66 of the second fin 60 are engaged in the upper latch slots 46 of said next first fin 40, in much the same way as described above in relation to the lower latches 66 and the lower latch slots 46. The tongues 68 of the second fin 60 are simultaneously aligned with the cutouts 48 of said next first fin 40. Each tongue 68 is then bent perpendicularly forwardly to extend through a corresponding cutout 48, and a distal end of the tongue 68 is further bent perpendicularly inwardly to engage with said next first fin 40 above a corresponding upper latch slot 46 thereof. Said next first fin 40 is thus connected to the second fin 60, with a uniform space separating said next first fin 40 and the second fin 60. The bottom flange 42 of said next first fin 40 is coplanar with the bottom flanges 42, 62 of the first fin 40 and the second fin 60. A combined structure having two first fins 40 and one second fin 60 is thus achieved.

Then other first and second fins 40, 60 are interleavingly connected to the combined structure in the same way as described above, with uniform spaces separating adjacent first and second fins 40, 60. The numbers of first and second fins 40, 60 used may be varied according to need. The bottom flanges 42, 62 of the first and second fins 40, 60 are located in a same plane. The bottom flanges 42, 62 are used to contact a heat generating component such as a CPU package.

In the heat sink assembly 20 of the present invention, interlocking devices such as the latch slots 46 and the latches 66 are formed around respective center portions of the main bodies 44, 64 of the first and second fins 40, 60. Thus, the main bodies 44, 64 of the adjacent first and second fins 40, 60 are effectively protected from being deformed toward each other. In addition, the first and second fins 40, 60 are interleavingly interconnected by staggered interlocking devices. That is, each first fin 40 is engaged with two adjacent second fins 60 by interlocking devices formed at different positions on the respective second fins 60. This configuration enhances an overall sturdiness of the heat sink assembly 20, so that the risk of any of the first and second fins 40, 60 disengaging from each other is minimized.

In the preferred embodiment of the present invention, the upper latches 66 extend forwardly, and the lower latches 66 extend rearward. In alternative embodiments of the present invention, the latches 66 may be arranged at other suitable locations on the main body 64 of the second fin 60. For example, a pair of lower latches 66 may extend forwardly from the main body 64, and a pair of upper latches 66 may extend rearward from the main body 64. In another example, an upper latch 66 and a lower latch 66 may extend forwardly from the main body 64, with said upper and lower latches 66 being diagonally opposite from each other. Another upper latch 66 and another lower latch 66 may extend rearward from the main body 64, with said upper and lower latches 66 being diagonally opposite from each other and being located in staggered fashion in relation to the forwardly extending upper and lower latches 66. Whatever alternative configuration is selected for the latches 66, corresponding parts of the second fin 60 and the first fin 40 may be configured accordingly.

Further, in the preferred embodiment of the present invention, the tongues 68 are provided on the second fins 60, and the cutouts 48 are defined in the first fins 40. In an alternative embodiment, the tongues 68 may be provided on the first fins 40, and the cutouts 48 may be defined in the second fins 60.

It is understood that the invention may be embodied in other forms without departing from the spirit thereof. The above-described examples and embodiments are to be considered in all respects as illustrative and not restrictive, and the invention is not to be limited to the details given herein.

What is claimed is:

1. A heat sink assembly for cooling a heat-generating device, the heat sink assembly comprising:
   a plurality of parallel first fins each comprising a first main body, and a flange extending therefrom; and
   a plurality of parallel second fins interleaved with the first fins, each of the second fins comprising a second main body having a different structure from the first main body, and a flange extending therefrom; wherein
   complementary interconnecting devices are formed on the first and second main bodies of the first and second fins to interconnect adjacent first and second fins.

2. The heat sink assembly as described in claim 1, wherein the complementary interconnecting devices comprise a plurality of latches extending from each of the second main bodies, and further comprise a plurality of latch slots defined in each of the first main bodies, the latch slots engagingly receiving the latches therein.

3. The heat sink assembly as described in claim 2, wherein the latches and latch slots are located around respective center portions of the first and second main bodies.

4. The heat sink assembly as described in claim 2, wherein the latches of each of the second fins extend in opposite directions toward adjacent front and rear first fins, the latches being engagingly received in corresponding latch slots of said adjacent front and rear first fins.

5. The heat sink assembly as described in claim 4, wherein each of the latches defines a notch in an edge thereof that is perpendicular to the second main body, and the notches engagingly receiving the main bodies of said adjacent front and back first fins at ends of corresponding latch slots.

6. The heat sink assembly as described in claim 5, wherein each of the second fins comprises a pair of tongues arranged at opposite sides thereof, each of the first fins defines a pair of cutouts in opposite sides thereof receiving the tongues therethrough respectively, and each of the tongues comprises a distal end bent to engage with an adjacent first fin at an inmost end of a corresponding cutout.

7. The heat sink assembly as described in claim 1, wherein each of the first and second fins comprises a bent tab extending from a top edge thereof, the bent tab abutting either a corresponding adjacent first fin or second fin.

8. The heat sink assembly as described in claim 1, wherein the flanges extend from bottom edges of the respective first and second fins, the flanges abut the bottom edges of corresponding adjacent second fins and first fins respectively, and the flanges are located in a same plane.

9. A heat sink assembly for cooling a heat-generating device, the heat sink assembly comprising:
 a plurality of parallel first fins each comprising a main body with at least two latch slots defined therein; and
 a plurality of parallel second fins each comprising a main body with at least two latches extending therefrom in opposite directions; wherein
 the first fins and the second fins are assembled in an interleaved fashion, so that the at least two latches engage in at least two latch slots of two adjacent first fins respectively, and the at least two latch slots receive at least two latches of two adjacent second fins respectively.

10. The heat sink assembly as described in claim 9, wherein each of the at least two latches defines a notch in an edge thereof that is perpendicular to the main body, the notches engagingly receiving the main bodies of said two adjacent first fins at ends of corresponding latch slots.

11. The heat sink assembly as described in claim 9, wherein each of the first and second fins comprises a bottom flange extending from a bottom edge of the main body thereof in a same direction, and the bottom flanges are located in a same plane.

12. The heat sink assembly as described in claim 9, wherein a pair of tongues is arranged at opposite sides of one of the adjacent first and second fins, the other of the adjacent first and second fins defines a pair of cutouts in opposite sides thereof, the cutouts receiving the tongues therethrough respectively, and each of the tongues of said one of the adjacent first and second fins comprises a distal end bent to engage with said other of the adjacent first and second fins at an end of a corresponding cutout.

13. A heat sink assembly for cooling a heat-generating device, the heat sink assembly comprising:
 a plurality of first fins and a plurality of second fins alternately arranged with each other;
 for each first fin, at least one first interlocking structure formed on said first fin and a neighboring second fin located on a right side to fix each other, and at least one second interlocking structure formed on said first fin and another neighboring second fin located on a left side to fix each other; wherein
 said at least one first interlocking structure and said at least one second interlocking structure are arranged in a manner that any one of said at least one first interlocking structure is not aligned with any one of said at least one second interlocking structure in a direction perpendicular to a plane defined by said first fin.

14. The heat sink assembly as described in claim 13, wherein each of the first and second fins comprises an outer periphery and a center area, and said at least one first interlocking structure and said at least one second interlocking structure are formed around the center area.

15. The heat sink assembly as described in claim 13, wherein for each first fin, a connecting structure is formed on said first fin and one of the neighboring second fins to further connect said first fin and said one of the neighboring second fins together.

16. The heat sink assembly as described in claim 15, wherein the connecting structure comprises a tongue arranged at a side of one of said first fin and said one of the neighboring second fins, and a cutout defined at a side of the other of said first fin and said one of the neighboring second fins, the tongue engaging with said other of said first fin and said one of the neighboring second fins at the cutout thereof.

17. The heat sink assembly as described in claim 16, wherein the tongue comprises a bent distal end extending through the cutout and engaging with said other of said first fin and said one of the neighboring second fins at an end of the cutout.

18. The heat sink assembly as described in claim 13, wherein said first fins having the at least one first interlocking structure thereon are structurally different from the second fins having the at least one second interlocking structure thereon.

\* \* \* \* \*